(12) United States Patent
Zheng et al.

(10) Patent No.: US 6,965,143 B2
(45) Date of Patent: Nov. 15, 2005

(54) RECESS CHANNEL FLASH ARCHITECTURE FOR REDUCED SHORT CHANNEL EFFECT

(75) Inventors: Wei Zheng, Santa Clara, CA (US); Mark W. Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 81 days.

(21) Appl. No.: 10/683,649

(22) Filed: Oct. 10, 2003

(65) Prior Publication Data
US 2005/0077566 A1    Apr. 14, 2005

(51) Int. Cl.[7] ............................................ H01L 29/788
(52) U.S. Cl. ........................ 257/315; 257/314; 257/301
(58) Field of Search ................................ 438/257, 221, 438/222

(56) References Cited

U.S. PATENT DOCUMENTS

| | | | | |
|---|---|---|---|---|
| 4,256,514 A | | 3/1981 | Pogge | |
| 5,773,343 A | * | 6/1998 | Lee et al. | 438/259 |
| 6,137,132 A | * | 10/2000 | Wu | 257/315 |
| 6,147,377 A | * | 11/2000 | Liu | 257/314 |
| 6,153,467 A | * | 11/2000 | Wu | 438/257 |
| 6,853,587 B2 | * | 2/2005 | Forbes | 365/185.28 |
| 2002/0024092 A1 | | 2/2002 | Palm et al. | |

* cited by examiner

*Primary Examiner*—Thao P. Le
(74) *Attorney, Agent, or Firm*—Renner, Otto, Boisselle & Sklar, LLP

(57) ABSTRACT

A memory cell with reduced short channel effects is described. A source region and a drain region are formed in a semiconductor substrate. A trench region is formed between the source region and the drain region. A recessed channel region is formed below the trench region, the source region and the drain region. A gate dielectric layer is formed in the trench region of the semiconductor substrate above the recessed channel region and between the source region and the drain region. A control gate layer is formed on the semiconductor substrate above the recessed channel region, wherein the control gate layer is separated from the recessed channel region by the gate dielectric layer.

31 Claims, 7 Drawing Sheets

RECESS CHANNEL FLASH ARCHITECTURE FOR REDUCED SHORT CHANNEL EFFECT

FIELD OF THE INVENTION

The present invention relates generally to flash memory devices and methods of forming the same and, more particularly, to flash memory having reduced short channel effects and methods for forming the same.

BACKGROUND OF THE INVENTION

A pervasive trend in modern integrated circuit manufacture is to produce semiconductor devices, such as memory cells, that are as small as possible. A typical memory cell, which generally is formed from a field effect transistor (FET), includes a source and a drain formed in an active region of a semiconductor substrate by implanting N-type or P-type impurities in the semiconductor substrate. Disposed between the source and the drain is a channel (or body) region. Disposed above the body region is a gate electrode. The gate electrode and the body are spaced apart by a gate dielectric layer. It is noted that memory cells can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. In FET devices with a channel having a relatively short length, the FET can experience a number of undesirable electrical characteristics referred to as short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

A typical technique used to minimize SCE is to fabricate FETs with extensions as part of the source/drain areas. The extensions are commonly formed using a lightly doped drain (LDD) technique as is well known in the art.

However, there still exists a need in the art for semiconductor devices, such as Memory cells, that have reduced SCE and for fabrication techniques to make those semiconductor devices.

SUMMARY OF THE INVENTION

In the light of the foregoing, one aspect of the invention relates to a memory cell including a semiconductor substrate having at least one trench formed in a surface thereof, a recessed channel region of a first conductivity type semiconductor formed in the semiconductor substrate at the bottom of each trench, a source region and a drain region both of a second conductivity type semiconductor formed in the semiconductor substrate on opposing sides of each trench, a gate dielectric layer formed on the semiconductor substrate, said gate dielectric layer being formed along the bottom and sidewalls of the trench, and a control gate layer formed over the gate dielectric layer above the recessed channel region.

A second aspect of the invention relates to a method of fabricating a memory cell, including the steps of forming at least one trench in a semiconductor substrate, forming a recessed channel region of a first conductivity type semiconductor in the semiconductor substrate at the bottom of each trench, forming a source region and a drain region both of a second conductivity type semiconductor in the semiconductor substrate on opposing sides of each trench, forming a gate dielectric layer on the semiconductor substrate, said gate dielectric layer being formed along the bottom and sidewalls of the trench, and forming a control gate layer over the gate dielectric layer above the recessed channel region.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF THE INVENTION

Figure 1A:
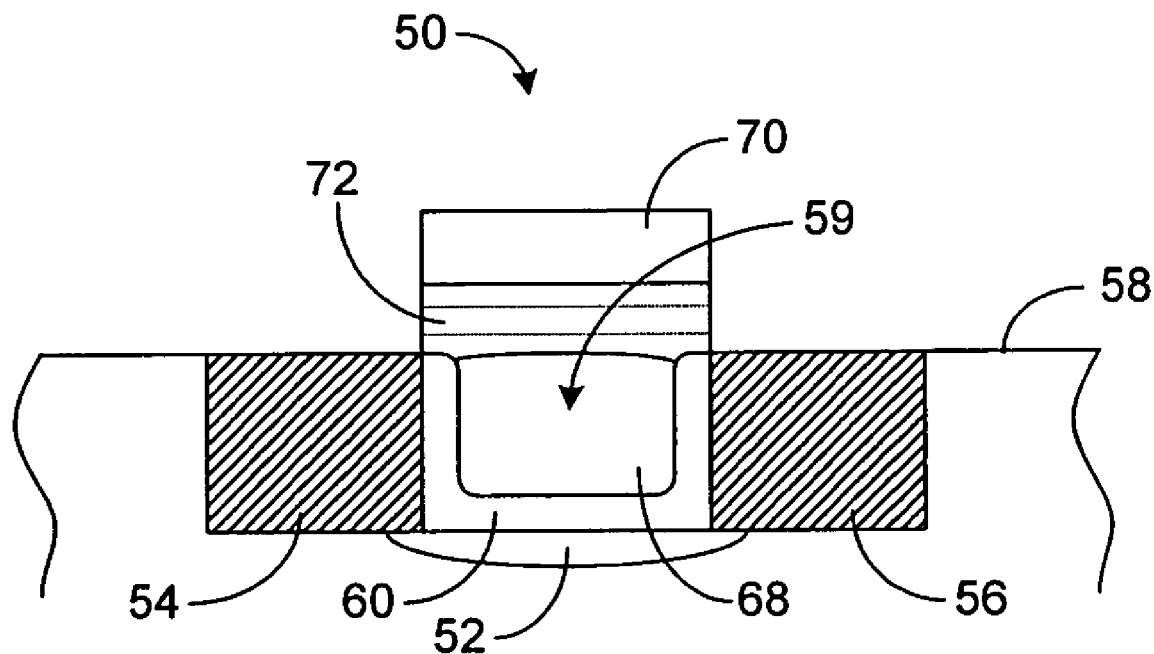
FIG. 1A is a cross-sectional view of a memory cell having a recessed channel in accordance with an embodiment (Floating Gate type) of the present invention.

The following is a detailed description of the present invention in conjunction with the attached drawings, wherein like reference numerals will refer to like elements throughout.

Referring to FIG. 1A, a memory cell 50 in accordance with an embodiment of the present invention is illustrated. The memory cell 50 includes a lightly doped P-conductivity recessed channel region 52 disposed below an N-conductivity source region 54 and an N-conductivity drain region 56. The source region 54 and the drain region 56 extend from the surface of the wafer 58 to the recessed channel region 52. A trench region 59 is formed in the substrate above the recessed channel region 52 and between the source region 54 and the drain region 56. A gate dielectric layer 60 is formed along the bottom and sidewalls of the trench region 59 and thus maintains the "trench shape" of the trench region 59, as illustrated in FIG. 1A, for example. The gate dielectric layer 60 may comprise, for example, $SiO_2$.

Figure 1B:
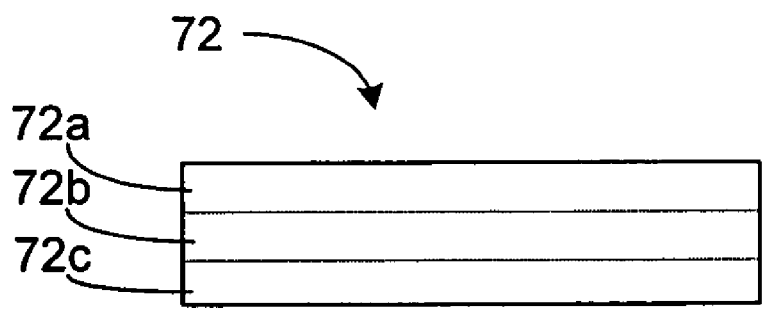
FIG. 1B is a cross-sectional view showing the Oxide-Nitride-Oxide (ONO) layer of the intergate dielectric layer in accordance with the embodiment illustrated in FIG. 1A.

Disposed above the gate dielectric layer 60 is a floating gate layer 68, such as, for example, a polysilicon floating gate layer. The floating gate layer 68 resides in the trench region 59. Above the floating gate layer 68 is a control gate layer 70, such as a polysilicon control gate, for example. Dispersed between the control gate layer 70 and the floating gate layer 68 is an intergate dielectric layer 72, which insulates the control gate layer 70 from the floating gate layer 68. In one embodiment, the intergate dielectric layer is an oxide-nitride-oxide (ONO) layer. Gate dielectric layers composed of ONO are well known in the art and will not be discussed in detail herein. Referring briefly to FIG. 1B, the ONO layer 72 includes a silicon nitride layer 72b sandwiched between a top silicon dioxide layer 72a and a bottom silicon dioxide layer 72c.

It will be appreciated by those skilled in the art that while the memory cell 50 is implemented on a bulk silicon substrate, the invention also may be implemented using SOI technology, for example.

As is known by those having ordinary skill in the art, as a FET (e.g., memory cell) is downscaled, the channel length of the FET is reduced in length and the FET experiences undesirable electrical characteristics known as short channel effect (SCE).

SCE is an undesired phenomenon in which, as the channel length decreases, the area affected by a drain voltage increases to cover an area immediately below a gate electrode, pulling down the potential of the semiconductor substrate surface, and resulting in variations (fall) of threshold voltage and reduction in the actual channel length. SCE becomes more severe as the device physical dimensions and, more specifically, as the FET channel length is scaled down. This result is due to the fact that the band gap and the built-in potential at the junctions are an intrinsic property (constant) of the crystalline materials (such as silicon), and are non-scalable with the further reduction in device dimensions.

When SCE becomes severe, the drain current can no longer be controlled by the gate voltage due to a so-called punch-through phenomenon that causes an increased leakage current between the source and drain. Punch-through thus causes degradation of, for example, the memory retention capability in the transfer gate of a memory cell.

When comparing similarly scaled devices, the recessed channel region 52 of the present invention reduces SCE by allowing an increased channel length relative to prior art configurations. In particular, the recessed channel region 52 of the present invention is not limited to the distance between the source region 54 and drain region 56. More specifically, since the channel region 52 is below the source region 54 and drain region 56, the channel region 52 can extend beyond the confines of the source region 54 and drain region 56, e.g., under the source region and drain region and essentially forms a "U" shape channel.

Figure 2:
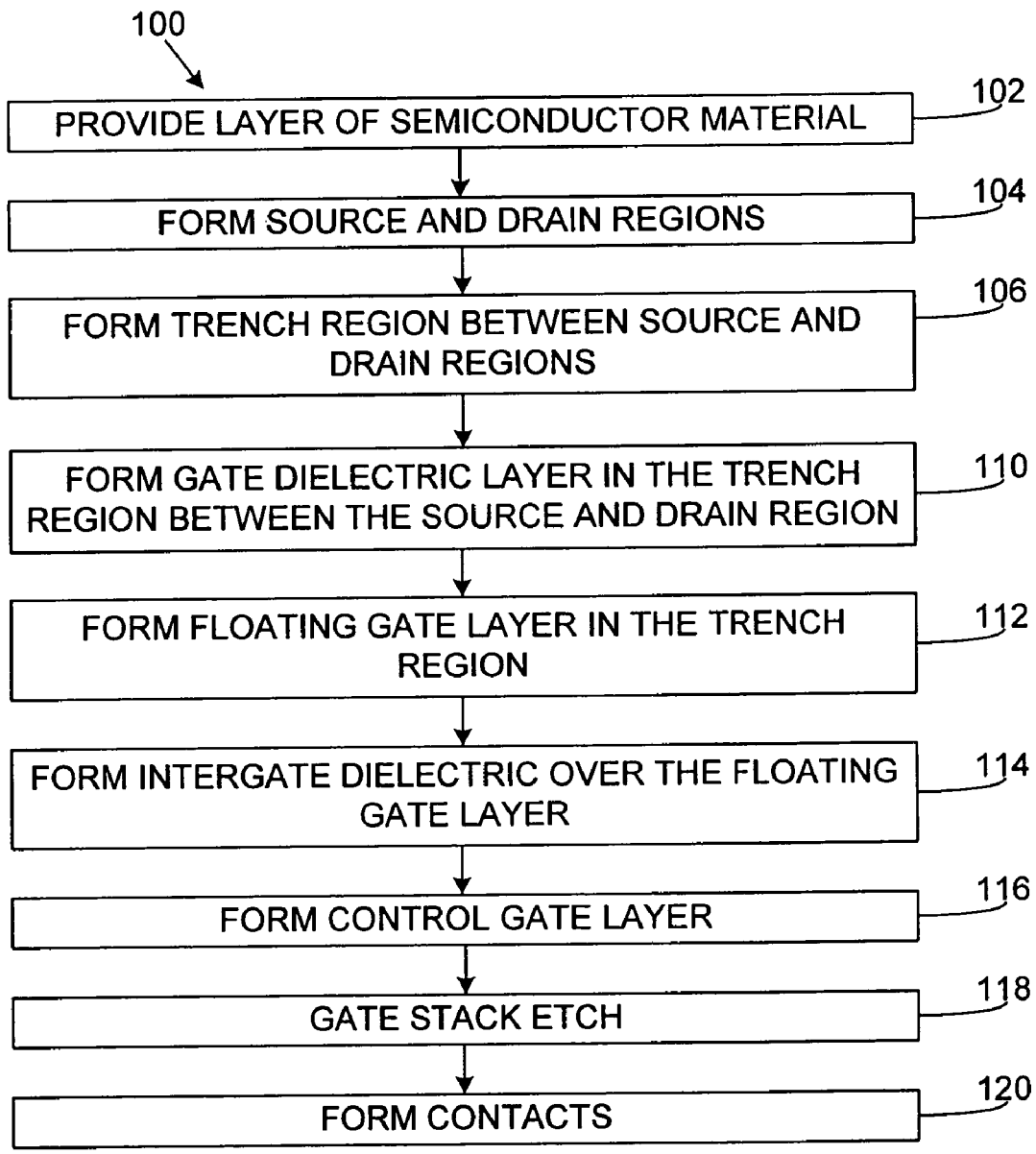
FIG. 2 is a flow chart showing exemplary processing steps in the fabrication of a memory cell in accordance with the embodiment illustrated in FIG. 1A.
Figure 3A:
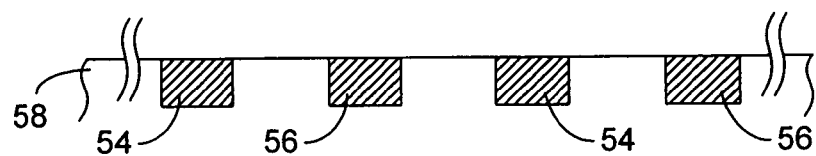
FIG. 3A is a cross section diagram showing a step in the fabrication of the memory cell in accordance with the embodiment illustrated in FIG. 1A.

Referring to the flowchart 100 of FIG. 2 in conjunction with the cross sectional diagrams of FIG. 3A–FIG. 3G, exemplary processing steps for fabricating memory cells 50 are shown. The process begins with a layer of semiconductor material 58, as shown in step 102. In step 104, source regions 54 and drain regions 56 are formed in the semiconductor wafer 58 as shown in FIG. 3A. Common methods for forming the source regions 54 and drain regions 56 include masking a region of the top of the semiconductor wafer 58 with a source drain channel mask and implanting N+ dopants to provide the N+ source regions 54 and N+ drain regions 56. A rapid thermal anneal (RTA) can be performed to activate the source regions 54 and the drain regions 56. Processes for such implantation and activation of dopant for formation of the source regions 54 and drain regions 56 are known to one having ordinary skill in the art of integrated circuit fabrication. Although a P-channel memory cell is discussed, one skilled in the art will appreciate that the memory cell is merely exemplary and that both N-channel and/or P-channel devices can be formed on the wafer 58.

Figure 3B:
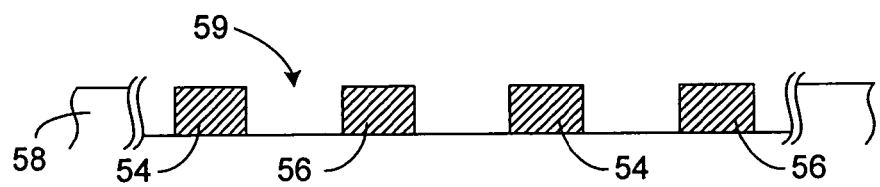
FIG. 3B is a cross section diagram showing a step in the fabrication of the memory cell in accordance with the embodiment illustrated in FIG. 1A.

In step 106, trenches 59 are formed between the respective source regions 54 and drain regions 58, as shown in FIG. 3B. For example, the silicon device layer is etched by forming a silicon nitride mask over the surface of the wafer 58 to define and expose the area corresponding to the trenches 59. A layer of silicon nitride is then formed by depositing a layer of silicon nitride on the top surface of the wafer 58 and patterning and etching the silicon nitride using conventional photolithography techniques to form a silicon nitride mask over the memory cell. Once masked, an anisotropic etch with an etching compound such as hydrogen bromide (Hbr) is used to etch the trenches 59 in the regions.

Figure 3C:
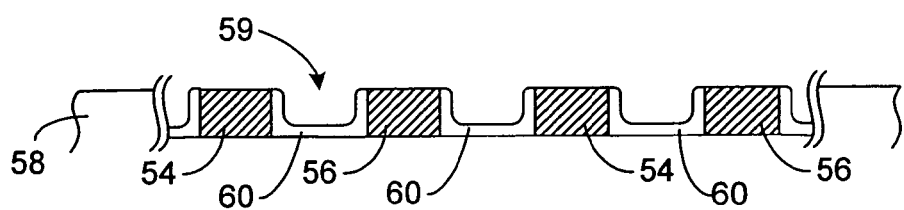
FIG. 3C is a cross section diagram showing a step in the fabrication of the memory cell in accordance with the embodiment illustrated in FIG. 1A.

In step 110, gate dielectric layers 60 are formed along the bottom and sidewalls of the trench regions 59. Each gate dielectric layer 60 maintains the trench shape of the respective trench region 59, as shown in FIG. 3C. The gate dielectric layers have a thickness on the order of 50 Angstroms to 150 Angstroms, and are formed using silicon dioxide, for example. In one embodiment the gate dielectric layers have a thickness of about 100 Angstroms. Conventional techniques for creating the gate dielectric layer 60 include using a compound such as $SiH_4$ or TEOS and performing a thermal oxidation to oxidize such compound to form silicon dioxide. Other techniques known to those skilled in the art also may be used.

Figure 3D:
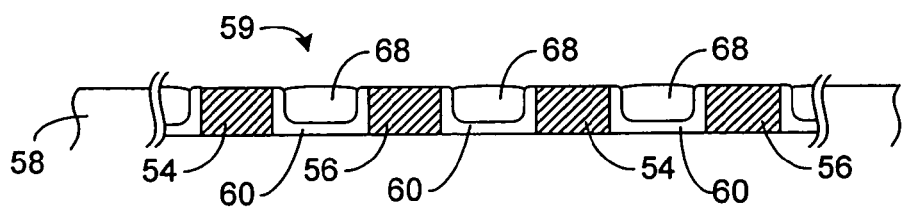
FIG. 3D is a cross section diagram showing a step in the fabrication of the memory cell in accordance with the embodiment illustrated in FIG. 1A.

In step 112, floating gates 68 are formed as shown in FIG. 3D. The floating gates 68 are formed in the trench regions 59 and each floating gate 68 occupies substantially all of a respective trench region 59. By way of example, floating gates are typically formed by depositing a conformal layer of doped polysilicon over the exposed surfaces of the gate dielectric layer. The layer of doped polysilicon is typically formed using conventional chemical vapor deposition (CVD) or plasma enhanced chemical vapor deposition (PECVD) techniques, or the like. The floating gate layer 59 then is selectively removed from the surface of the wafer 58.

Figure 3E:
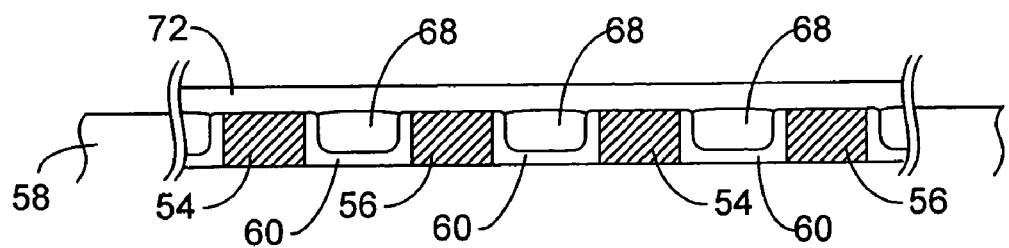
FIG. 3E is a cross section diagram showing a step in the fabrication of the memory cell in accordance with the embodiment illustrated in FIG. 1A.

Moving to step 114, the intergate dielectric layer 72 is formed, as shown in FIG. 3E. As discussed above, in one embodiment the intergate dielectric layer 72 is an ONO layer and includes a plurality of films, such as a bottom film of silicon dioxide 72c, a middle film of silicon nitride 72b, and a top film of silicon dioxide 72a, for example. The ONO layer 72 is formed over the floating gates 68 using conventional deposition techniques. The silicon nitride layer 77b is formed to a thickness of about 40 to 80 Angstroms, for example. The bottom silicon dioxide layer 72c is formed to a thickness of about 30 to 70 Angstroms, while the top silicon dioxide layer is formed to a thickness of about 30 to 70 Angstroms, for example. As recognized in the art, the ONO layer 72 may be formed by a three-stage process including forming a first film of silicon dioxide over the floating gate layer 68, depositing a film of silicon nitride on the silicon dioxide, and then depositing a second film of silicon dioxide on the silicon nitride film.

Figure 3F:
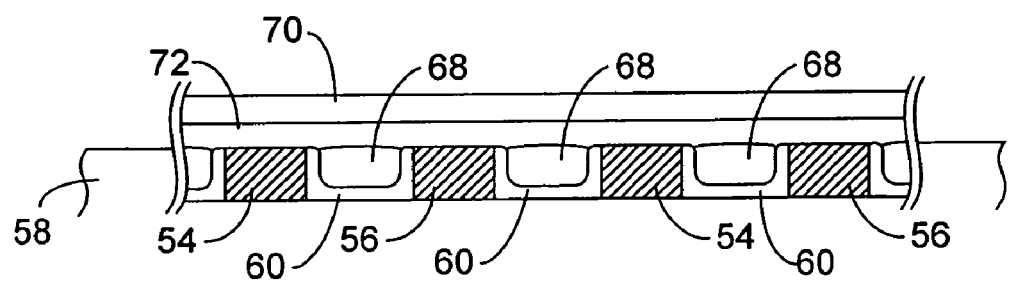
FIG. 3F is a cross section diagram showing a step in the fabrication of the memory cell in accordance with the embodiment illustrated in FIG. 1A.

In step 116, the control gate layer 70 is formed as shown in FIG. 3F. Formation of the control gate layer 70 includes, for example, depositing a layer of polysilicon material on the surface of the intergate dielectric layer 72 using low pressure chemical vapor deposition as is known by those skilled in the art.

Figure 3G:
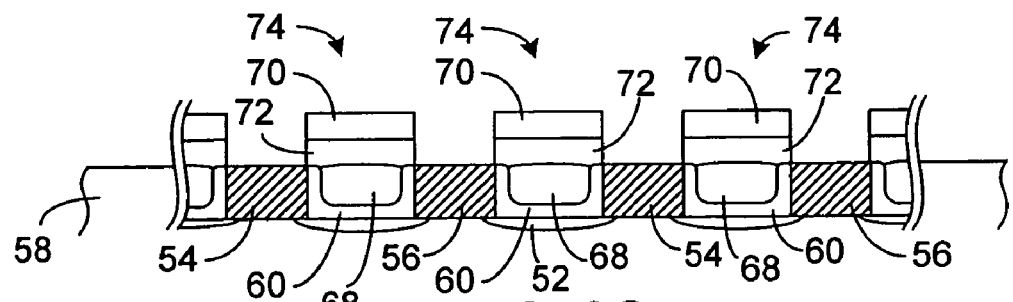
FIG. 3G is a cross section diagram showing a step in the fabrication of the memory cell in accordance with the embodiment illustrated in FIG. 1A.

In step 118, the gate stacks 74 are formed as shown in FIG. 3G. The control gate layer 70 and the intergate dielectric layer 72 are selectively removed, for example, by well-known photolithography and selective etching methods, to form the gate stacks 74 in a desired location. An example of a suitable etching method is reactive ion etching (RIE), using an appropriate etchant. It will be appreciated that a wide variety of other suitable gate structures as are known in the art may be formed in step 118.

The creation of the gate 70 defines a channel region 52, which is formed below the source region 54 and the drain region 56 of the memory cell 50, as illustrated in FIG. 3G, for example. The channel region 52 is controlled by a work function of the gate 70.

Although not shown, final processing steps are performed in step 120. For example, electrode contacts may be formed for establishing electrical connection to the memory cell 50. The memory cell 50 can be provided with a gate electrode contact to establish electrical connection to the control gate 70. If needed, source and drain contacts can also be provided. Other components, such as a cap (or passivation) layer, vias, conductor lines and any other appropriate components to interconnect devices formed on the wafer 58, also can be provided.

The above described embodiment is centered around a memory cell having a recessed channel region within a semiconductor substrate. More particularly, the present embodiment implements a memory cell utilizing a recessed channel region formed below a source region and a drain region. The recessed channel reduces SCE by allowing a longer channel region when compared to similarly scaled devices implementing prior art channel designs.

The memory cell 50 is programmed by applying a positive voltage (about 20 volts) to the control gate 70 and connecting the source region 54 to ground and the drain region 56 to a predetermined potential above the source region 54. A resulting high electric field across the gate dielectric layer 60 leads to a phenomena called "Fowler-Nordheim" tunneling. During this process, electrons in the core cell recessed channel region 52 tunnel through the gate dielectric layer into the floating gate 68 and become trapped in the floating gate since the floating gate is surrounded by the intergate dielectric layer 72 and the gate dielectric layer 60. Alternatively, a positive voltage is applied to the drain region 56 and the source region 54 is connected to ground. Thus, a lateral filed is set up to accelerate electrons from the source region to the drain region. These electrons gain energy as they approach the drain region and become channel hot electrons. In the meantime, a positive voltage (about 7–10 volts) is applied to the control gate 70 and a vertical field is set up to attract the hot electrons near the drain region 56 to jump over the silicon oxide barrier to the floating gate 68. As a result of the trapped electrons, the threshold voltage of the cell increases. This change in the threshold voltage (and thereby the channel conductance) of the cell created by the trapped electrons is what causes the cell to be programmed.

In order to erase the memory cell 50, a positive voltage (8–10 volts) is applied to the source region 54, and the control gate 70 is held at a negative potential (−8 to −10 volts), while the drain region 56 is allowed to float. Under these conditions, an electric field is developed across the gate dielectric layer 60 between the floating gate 68 and the source region 54. The electrons that are trapped in the floating gate flow toward and cluster at the portion of the floating gate overlying the source region (or the channel region) and are extracted from the floating gate and into the source region by way of Fowler-Nordheim tunneling through the gate dielectric layer. As the electrons are removed from the floating gate, the cell is erased.

The conventional technique of reading the memory cell 50 is to apply read voltages to the control gate 70 (3–5 volts) and drain region 56 (0.1–1 volts, typically 0.5 volts) and to ground the source region 54. This is similar to the method of programming with the difference being that lower level voltages are applied during reading than during programming. Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa.

Figure 4A:
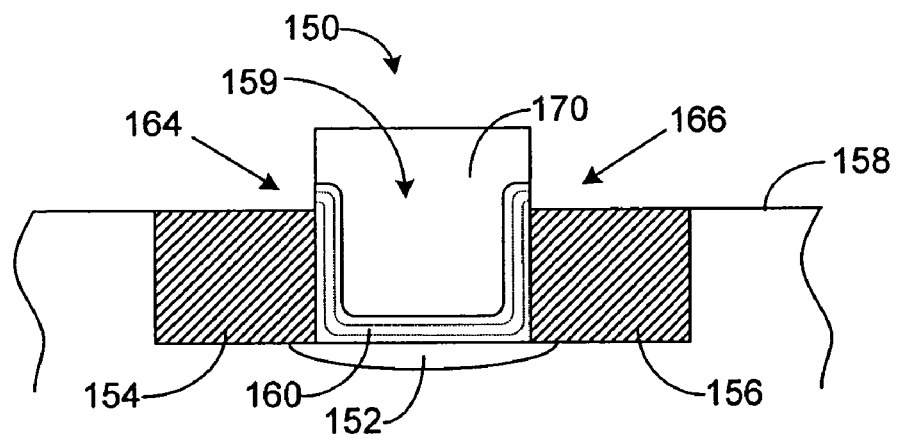
FIG. 4A is a cross-sectional view of a memory cell having a recessed channel in accordance with another embodiment (MirrorBit type) of the present invention.

Referring to FIG. 4A, a memory cell 150 in accordance with another embodiment of the present invention is illustrated. The memory cell 150 is a silicon-oxide-nitride-oxide-silicon (SONOS) device and includes a lightly doped P-conductivity channel region 152 disposed below an N-conductivity source region 154 and an N-conductivity drain region 156. The source region 154 and the drain region 156 extend from the surface of the wafer 158 to the recessed channel region 152. A trench region 159 is formed in the substrate above the recessed channel region 152 and between the source region 154 and the drain region 156. A gate dielectric layer 160 is formed along the bottom and sidewalls of the trench region 159 and thus maintains the "trench shape" of the trench region 159 as illustrated in FIG.

4A, for example. The gate dielectric layer 160 has a thickness on the order of 100 Angstroms to 300 Angstroms, and typically is about 200 Angstroms, for example.

Figure 4B:
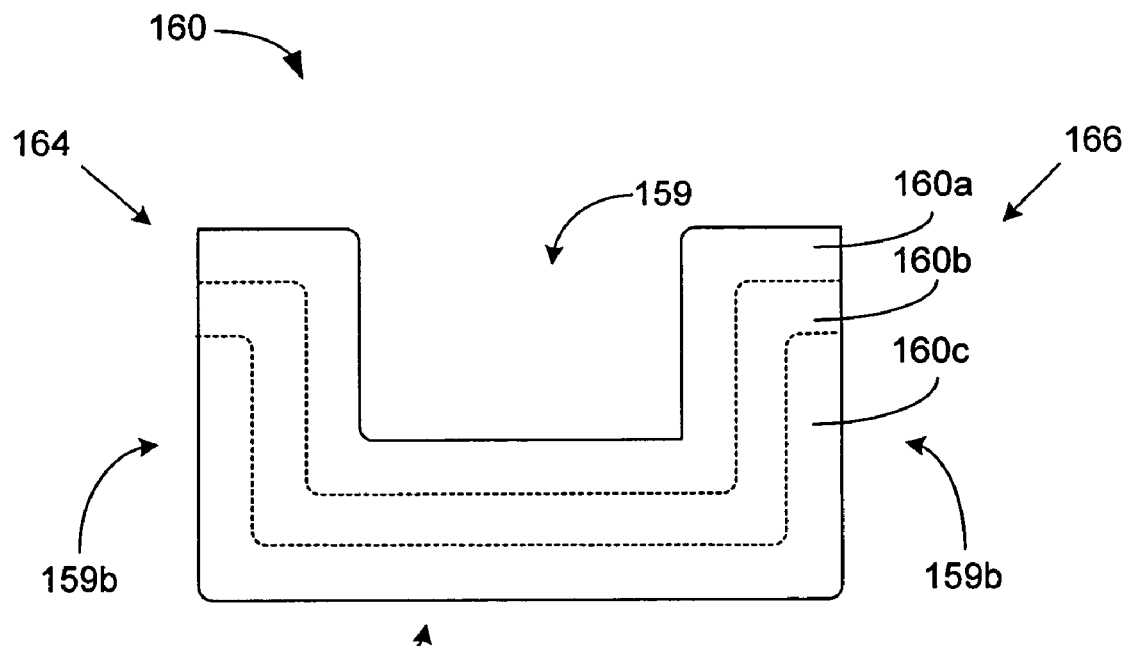
FIG. 4B is a cross-sectional view showing the Oxide-Nitride-Oxide (ONO) layer of the gate dielectric layer in accordance with the embodiment illustrated in FIG. 4A.

The gate dielectric layer 160 includes two insulating layers 160a, 160c, and a charge trapping layer 160b, as shown in FIG. 4B. In one embodiment, the gate dielectric layer 160 is an ONO layer. The gate dielectric layer 160 is formed in the trench region 159 such that the insulating layers 160a, 160c insulate the charge trapping layer 160b both above and below the gate dielectric layer 160. For example, along the floor 159a of the trench region 159, each layer 160a, 160b, 160c is substantially parallel to the floor 159a. As the gate dielectric layer 160 is formed along the side walls 159b of the trench region 159, each layer 160a, 160b, 160c is substantially parallel to the side walls 159b. At the source junction 164 and the drain junction 166, each layer 160a, 160b, 160c is formed substantially parallel to the top surface of the wafer 158. Furthermore, the gate dielectric layer 160 extends above the source region 154 and drain region 156 of the memory cell 150 to prevent the charge trapping layer 160b from contacting the source region 154 and the drain region 156.

Disposed above the gate dielectric layer 160 is a control gate layer 170, such as, for example, a polysilicon control gate layer. The control gate layer 170 resides within and above the trench region 159 formed by the gate dielectric layer 160 between the source region 154 and the drain region 156.

It will be appreciated by those skilled in the art that while the memory cell 150 is implemented on a bulk silicon substrate, the invention also may be implemented using SOI technology, for example.

As was discussed above, as a FET (e.g., memory cell) is downscaled, the channel length of the FET is reduced in length and the FET experiences undesirable electrical characteristics known as short channel effect (SCE).

When comparing similarly scaled devices, the recessed channel region 152 of the present invention reduces SCE by allowing an increased channel length relative to prior art configurations. In particular, the recessed channel region 152 of the present invention is not limited to the distance between the source region 154 and drain region 156. More specifically, since the recessed channel region 152 is below the source region 154 and drain region 156, the channel region 152 can extend beyond the confines of the source region 154 and drain region 156 and form a "U" shape channel, thus creating a longer channel than found in a similarly scaled prior art configuration.

Figure 5:
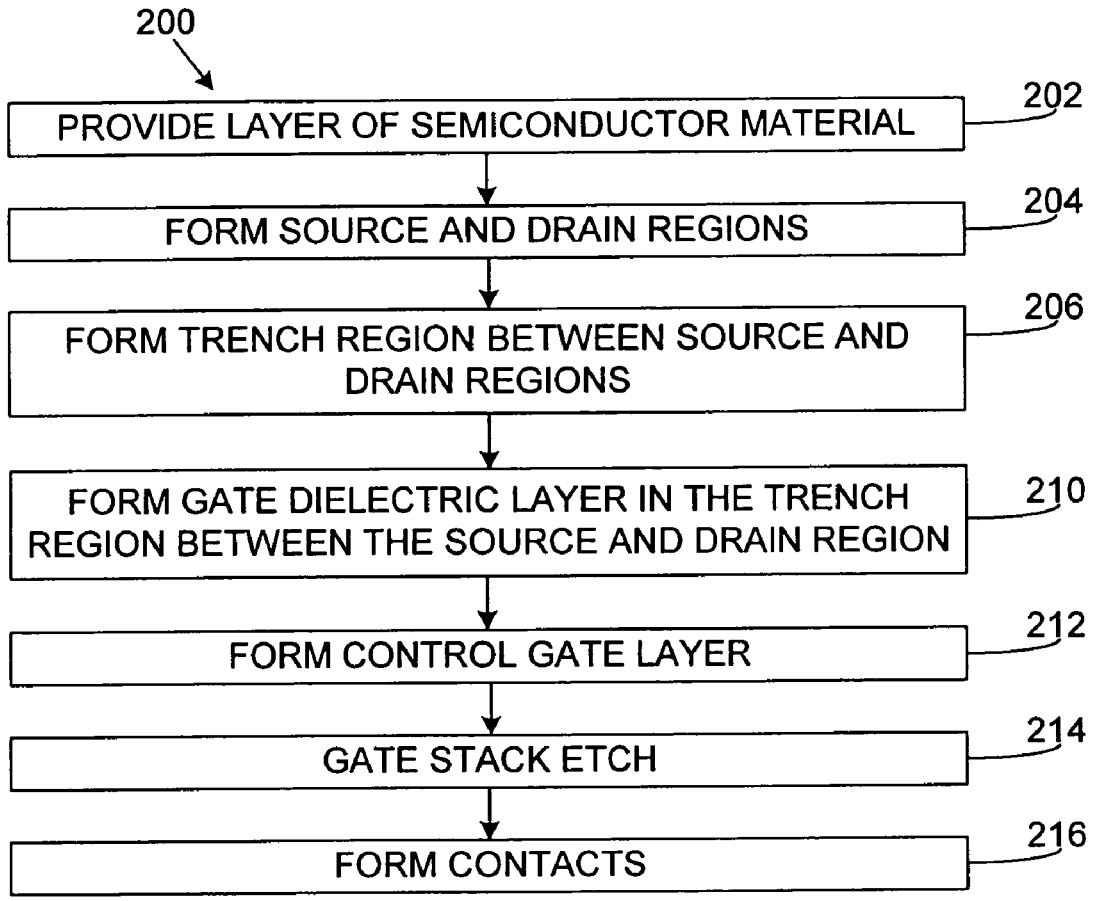
FIG. 5 is a flow chart showing exemplary processing steps in the fabrication of a memory cell in accordance with the embodiment illustrated in FIG. 4A.
Figure 6A:
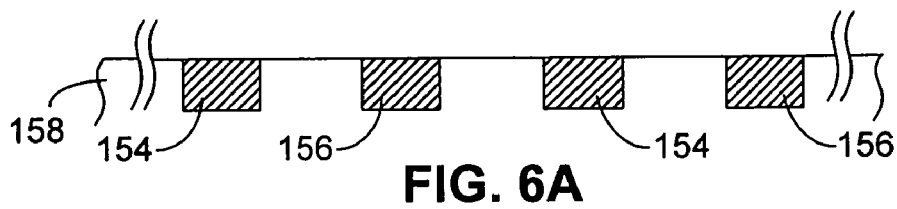
FIG. 6A is a cross section diagram showing a step in the fabrication of the memory cell in accordance with the embodiment illustrated in FIG. 4A.

Referring to the flowchart 200 of FIG. 5 in conjunction with the cross sectional diagrams of FIG. 6A–FIG. 6E, exemplary processing steps for fabricating memory cells 150 are shown. The process begins with a layer of semiconductor material 158 as shown in step 202. In step 204, source regions 154 and drain regions 156 are formed in the semiconductor wafer 158 as shown in FIG. 6A. Common methods for forming the source regions 154 and drain regions 156 include masking a region of the top of the semiconductor wafer 158 with a source drain channel mask and implanting N+ dopants to provide the N+ source region 154 and N+ drain region 156. A rapid thermal anneal (RTA) can be performed to activate the source regions 154 and drain regions 156. Processes for such implantation and activation of dopant for formation of the source regions 154 and drain regions 156 are known to one having ordinary skill in the art of integrated circuit fabrication. Although a P-channel memory cell is discussed, one skilled in the art will appreciate that the memory cell is merely exemplary and that both N-channel and/or P-channel devices can be formed on the wafer 158.

Figure 6B:
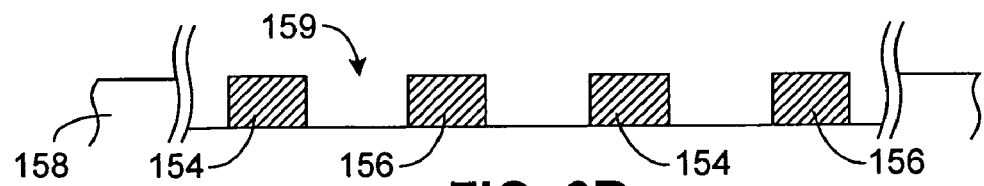
FIG. 6B is a cross section diagram showing a step in the fabrication of the memory cell in accordance with the embodiment illustrated in FIG. 4A.

In step 206, trench regions 159 are formed between the respective source regions 154 and drain regions 158, as shown in FIG. 6B. For example, the silicon device layer is etched by forming a silicon nitride mask over the surface of the wafer 158 to define and expose the area corresponding to the trench regions 159. A layer of silicon nitride is then formed by depositing a layer of silicon nitride on the top surface of the wafer 158 and patterning and etching the silicon nitride using conventional photolithography techniques to form a silicon nitride mask over the memory cell. Once masked, an anisotropic etch with an etching compound such as hydrogen bromide (Hbr) is used to etch the trench 159 in the region.

Figure 6C:
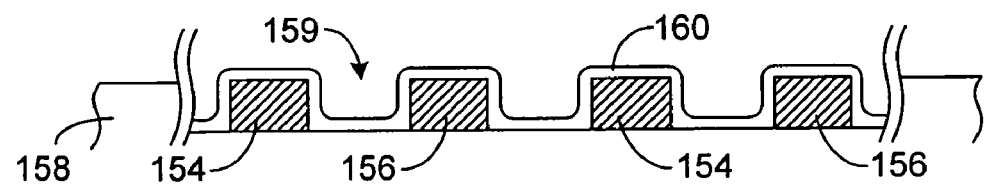
FIG. 6C is a cross section diagram showing a step in the fabrication of the memory cell in accordance with the embodiment illustrated in FIG. 4A.

In step 210, the gate dielectric layer 160 is formed. The gate dielectric layer 160 is formed to conform to the shape of the trench region 159, as shown in FIG. 6C. Furthermore, the gate dielectric layer may be formed over the source regions 154 and drain regions 156. In one embodiment, the gate dielectric layer is formed using an ONO layer 160. The ONO layer 160 is formed using conventional deposition techniques to a thickness of about 100 to 300 Angstroms. The silicon nitride layer 160b is formed to a thickness of about 40 to 100 Angstroms, for example. The bottom silicon dioxide layer 160c is formed to a thickness of about 30 to 100 Angstroms, while the top silicon dioxide layer 160a is formed to a thickness of about 40 to 100 Angstroms, for example. As recognized in the art, the ONO layer 160 may be formed by a three-stage process including forming a first film of silicon dioxide, depositing a film of silicon nitride on the silicon dioxide, and then depositing a second film of silicon dioxide on the silicon nitride film. In another embodiment, the second oxide layer on top of the nitride layer can be replaced with a high-K material, such as $Al_2O_3$, for example. As used herein, "standard-K dielectric material" refers to a material, or stack of materials, having a relative permittivity below 10, while "high-K dielectric material" refers to a material, or stack of materials, having a relative permittivity of about 10 or above.

Figure 6D:
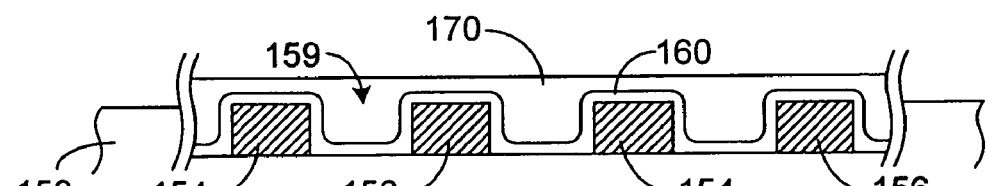
FIG. 6D is a cross section diagram showing a step in the fabrication of the memory cell in accordance with the embodiment illustrated in FIG. 4A.

In step 212, the control gate layer 170 is formed as shown in FIG. 6D. The control gate layer 170 substantially occupies all of the remaining trench region 159, and may extend above the surface of the wafer 158. Formation of the control gate layer 170 includes, for example, depositing a layer of polysilicon material on the surface of the gate dielectric layer 160 using low pressure chemical vapor deposition as is known by those skilled in the art.

Figure 6E:
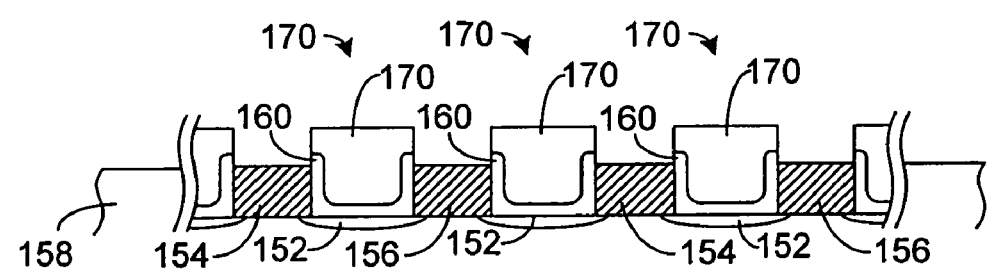
FIG. 6E is a cross section diagram showing a step in the fabrication of the memory cell in accordance with the embodiment illustrated in FIG. 4A.

In step 214, the gate stacks 174 are formed as shown in FIG. 6E. The control gate layer 170 and the gate dielectric layer 159 may be selectively removed, for example, by well-known photolithography and selective etching methods, to form the gate stacks 174 in a desired location. An example of a suitable etching method is reactive ion etching (RIE), using an appropriate etchant. It will be appreciated that a wide variety of other suitable gate structures as are known in the art may be formed in step 214.

The creation of the gate 170 defines a channel region 152, which is formed below the source region 154 and the drain region 156 of the memory cell 150, as illustrated in FIG. 6E, for example. The channel region 152 is controlled by a work function of the gate 170.

Although not shown, final processing steps are performed in step 216. For example, electrode contacts may be formed for establishing electrical connection to the memory cell 150. The memory cell 150 can be provided with a gate electrode contact to establish electrical connection to the control gate 170. If needed, source and drain contacts can also be provided. Other components, such as a cap (or passivation) layer, vias, conductor lines and any other appropriate components to interconnect devices formed on the wafer 158, can also be provided.

As in the first embodiment, the above described embodiment is centered around a memory cell having a recessed channel region within a semiconductor substrate. More particularly, the present embodiment implements a memory cell utilizing a recessed channel region formed below a source region and a drain region. The recessed channel reduces SCE by allowing a longer channel region when compared to similarly scaled devices implementing prior art channel designs.

The memory cell 150 is programmed by applying voltages to the gate 170 (7–10 volts) and drain region 156 (or source region) (4–6 volts) that create vertical and lateral electrical fields which accelerate electrons from the source region 154 (or drain region) along the length of the recessed channel 152. As the electrons move along the channel some of them gain sufficient energy to jump over the potential barrier of the bottom silicon dioxide layer 160c and become trapped in the silicon nitride layer 160b. The threshold voltage of the portion of the channel near the source region 154 or the drain region 156 under the region of trapped charge increases as more electrons are injected into the nitride layer 160b.

The memory cell 150 can be erased by simultaneously applying a negative potential to the gate 170 (−4 to −8 volts) and a positive potential to the drain region 156 (4–8 volts) such that the band bending near the drain region creates hot holes in the region, and under the vertical field established by the gate and drain voltages, these hot holes can jump over the oxide barrier and be trapped in the nitride storage layer to neutralize the electrons trapped there during the programming operation.

The conventional technique of reading the memory cell 150 is to apply read voltages to the control gate 170 (3–5 volts) and drain region 156 (1–2 volts) and to ground the source region 154. This is similar to the method of programming with the difference being that lower level voltages are applied during reading than during programming. Since the charge trapping layer is non-conductive, the trapped charge is localized near the drain or source region. Therefore, two bits can be stored in a single cell. In a programmed device, the threshold is therefore high for either the source region or the drain region. By applying the proper read voltage on either drain or source region, the two bits can be read individually.

While particular embodiments of the invention have been described in detail, it is understood that the invention is not limited correspondingly in scope, but includes all changes, modifications and equivalents coming within the spirit and terms of the claims appended hereto.

What is claimed is:

1. A memory cell, comprising:
    a semiconductor substrate having at least one trench formed in a surface thereof;
    a recessed channel region of a first conductivity type semiconductor formed in the semiconductor substrate at the bottom of each trench;
    a source region and a drain region both of a second conductivity type semiconductor formed in the semiconductor substrate on opposing sides of each trench, said source and drain region extending to substantially the bottom of said trench;
    a gate dielectric layer formed on the semiconductor substrate, said gate dielectric layer being formed along the bottom and sidewalls of the trench; and
    a control gate layer formed over the gate dielectric layer above the recessed channel region.

2. The memory cell of claim 1, wherein the thickness of the gate dielectric layer between the top surface of the gate dielectric layer and the bottom surface of the gate dielectric layer is between 100 and 300 angstroms in thickness.

3. The memory cell of claim 1, wherein the semiconductor substrate is a silicon-on-insulator (SOI) semiconductor substrate.

4. The memory cell of claim 1, wherein the semiconductor substrate is a bulk silicon semiconductor substrate.

5. The memory cell of claim 1, wherein the memory cell is a silicon-oxide-nitride-oxide-silicon (SONOS) device.

6. The memory cell of claim 5, wherein the gate dielectric layer is an oxide-nitride-Oxide (ONO) layer.

7. The memory cell of claim 6, wherein the ONO layer is formed in the trench region so as to insulate the nitride layer from a floor region and a plurality of sidewall regions within the trench region.

8. The memory cell of claim 1, wherein the gate dielectric layer extends above the source region and the drain region.

9. The memory cell of claim 1, wherein the gate dielectric layer is comprised of a standard-K dielectric material.

10. The memory cell of claim 1, wherein the gate dielectric layer is comprised of a high-K dielectric material.

11. The memory cell of claim 10, wherein the high-K material is $Al_2O_3$.

12. The memory cell of claim 1, further comprising:
    a floating gate layer formed in the trench region and over the gate dielectric layer, said floating gate layer positioned between the source region and the drain region; and
    an intergate dielectric layer disposed between the floating gate layer and the control gate layer.

13. The memory cell of claim 12, wherein the thickness of the gate dielectric layer between the top surface of the gate dielectric layer and the bottom surface of the gate dielectric layer is between 50 and 150 angstroms in thickness.

14. The memory cell of claim 12, wherein the semiconductor substrate is a silicon-on-insulator (SOI) semiconductor substrate.

15. The memory cell of claim 12, wherein the semiconductor substrate is a bulk silicon semiconductor substrate.

16. The memory cell of claim 12, wherein the intergate dielectric layer is an oxide-nitride-oxide (ONO) layer.

17. A method of fabricating a memory cell, comprising the steps of:
    forming at least one trench in a surface of a semiconductor substrate;
    forming a recessed channel region of a first conductivity type semiconductor in the semiconductor substrate at the bottom of each trench;
    forming a source region and a drain region both of a second conductivity type semiconductor in the semiconductor substrate on opposing sides of each trench, said source and drain region extending substantially to the bottom of said trench;
    forming a gate dielectric layer on the semiconductor substrate, said gate dielectric layer being formed along the bottom and sidewalls of the trench; and
    forming a control gate layer over the gate dielectric layer above the recessed channel region.

18. The method of claim 17, further comprising the step of:
forming the gate dielectric layer between the top surface of the gate dielectric layer and the bottom surface of the gate dielectric layer between 100 and 300 angstroms in thickness.

19. The method of claim 17, further comprising the step of:
using a silicon-on-insulator (SOI) semiconductor substrate as the semiconductor substrate.

20. The method of claim 17, further comprising the step of:
using a bulk silicon semiconductor substrate as the semiconductor substrate.

21. The method of claim 17, further comprising the step of:
using an oxide-nitride-oxide (ONO) layer to form, the gate dielectric layer.

22. The method of claim 21, further comprising the step of:
forming the ONO layer in the trench region so as to insulate the nitride layer from a floor region and a plurality of sidewall regions within the trench region.

23. The method of claim 17, further comprising the step of:
extending the gate dielectric layer above the source region and the drain region.

24. The method of claim 17, further comprising the step of:
using a standard-K dielectric material to form the gate dielectric layer.

25. The method of claim 17, further comprising the step of:
using a high-K dielectric material to form the gate dielectric layer.

26. The method of claim 25, wherein the step of using a high-K material to form the gate dielectric layer includes using $Al_2O_3$.

27. The method of claim 17, further comprising the steps of:
forming a floating gate layer in the trench region of the gate dielectric layer, the floating gate layer positioned between the source region and the drain region; and
forming an intergate dielectric layer between the floating gate layer and the control gate layer.

28. The method of claim 27, further comprising the step of:
forming the gate dielectric layer between the top surface of the gate dielectric layer and the bottom surface of the gate dielectric layer between 50 and 150 angstroms in thickness.

29. The method of claim 27, further comprising the step of:
using a silicon-on-insulator (SOI) semiconductor substrate as the semiconductor substrate.

30. The method of claim 27, further comprising the step of:
using a bulk silicon semiconductor substrate as the semiconductor substrate.

31. The method of claim 27, further comprising the step of:
using an oxide-nitride-oxide (ONO) layer to form the intergate dielectric layer.

* * * * *